United States Patent
Chiu et al.

(10) Patent No.: US 10,777,260 B1
(45) Date of Patent: Sep. 15, 2020

(54) STATIC RANDOM ACCESS MEMORY

(71) Applicant: UNITED MICROELECTRONICS CORP., Hsin-chu (TW)

(72) Inventors: Zih-Yu Chiu, Hsinchu (TW); Hsin-Wen Chen, Hsinchu County (TW); Ya-Nan Mou, Hsinchu (TW); Yuan-Hui Chen, Hsinchu (TW); Chung-Cheng Tsai, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/655,220

(22) Filed: Oct. 16, 2019

(30) Foreign Application Priority Data

Sep. 17, 2019 (CN) .......................... 2019 1 0877534

(51) Int. Cl.
| | |
|---|---|
| *G11C 11/00* | (2006.01) |
| *G11C 11/412* | (2006.01) |
| *G11C 11/419* | (2006.01) |
| *H01L 27/11* | (2006.01) |

(52) U.S. Cl.
CPC .......... *G11C 11/412* (2013.01); *G11C 11/419* (2013.01); *H01L 27/11* (2013.01)

(58) Field of Classification Search
CPC ...... G11C 11/412; G11C 11/419; H01L 27/11
USPC .......................................................... 365/154
See application file for complete search history.

(56) References Cited

U.S. PATENT DOCUMENTS

| | | | | |
|---|---|---|---|---|
| 6,091,626 A | * | 7/2000 | Madan .................. | G11C 11/412 365/154 |
| 6,510,076 B1 | * | 1/2003 | Lapadat ............... | G11C 11/4125 365/154 |
| 6,717,841 B2 | * | 4/2004 | Tsukikawa ........... | G11C 11/412 365/154 |
| 7,123,504 B2 | * | 10/2006 | Yabe ..................... | G11C 11/412 365/156 |
| 7,199,742 B2 | * | 4/2007 | Lin ...................... | H03K 3/35613 326/80 |
| 7,385,840 B2 | * | 6/2008 | Redwine .............. | G11C 11/412 365/154 |
| 8,339,838 B2 | * | 12/2012 | Ramaraju ............. | G11C 11/412 365/154 |
| 8,654,568 B2 | | 2/2014 | Houston | |
| 8,654,569 B2 | | 2/2014 | Houston | |
| 8,693,237 B2 | * | 4/2014 | Jou ....................... | G11C 11/412 365/154 |
| 8,711,598 B1 | * | 4/2014 | Chen ..................... | G11C 5/06 327/434 |

(Continued)

*Primary Examiner* — Viet Q Nguyen
(74) *Attorney, Agent, or Firm* — Winston Hsu

(57) ABSTRACT

An SRAM cell includes two inverters and three transistors. The first inverter includes a first end coupled to a first storage node and a second end coupled to a second storage node. The second inverter includes a first end coupled to the second storage node and a second end coupled to the first storage node. The first transistor includes a first end coupled to the first storage node, a second end and a control end. The second transistor includes a first end coupled to the second end of the first transistor, a second end coupled to a first bit line, and a control end. The third transistor includes a first end coupled between the second end of the first transistor and the first end of the second transistor, a second end, and a control end coupled to the first storage node.

9 Claims, 3 Drawing Sheets

(56) References Cited

U.S. PATENT DOCUMENTS

| | | | |
|---|---|---|---|
| 8,947,911 B1* | 2/2015 | Chen | G11C 11/419 365/154 |
| 8,953,401 B2* | 2/2015 | Chen | G11C 7/12 365/202 |
| 9,030,886 B2* | 5/2015 | Chen | G11C 5/14 365/185.24 |
| 9,536,597 B2* | 1/2017 | Pickering | G11C 11/412 |
| 9,552,872 B2* | 1/2017 | Jung | G11C 11/419 |
| 10,157,662 B1* | 12/2018 | Wu | G11C 11/412 |
| 10,276,578 B2* | 4/2019 | Chen | H01L 27/10897 |
| 10,381,056 B2* | 8/2019 | Lu | G11C 8/16 |
| 10,522,551 B2* | 12/2019 | Huang | H01L 23/5226 |
| 2007/0025140 A1* | 2/2007 | Redwine | G11C 11/412 365/154 |
| 2007/0035986 A1* | 2/2007 | Houston | G11C 7/1078 365/154 |
| 2007/0242513 A1* | 10/2007 | Chang | G11C 11/412 365/185.07 |
| 2009/0175069 A1* | 7/2009 | Houston | H01L 27/11 365/154 |
| 2010/0142258 A1* | 6/2010 | Tsai | G11C 11/412 365/154 |
| 2011/0044094 A1* | 2/2011 | Houston | G11C 8/16 365/154 |
| 2011/0068413 A1* | 3/2011 | Liaw | H01L 27/1104 257/393 |
| 2011/0205787 A1* | 8/2011 | Salters | G11C 11/412 365/154 |
| 2012/0195111 A1* | 8/2012 | Ramaraju | G11C 8/16 365/156 |
| 2012/0230086 A1* | 9/2012 | Chiu | G11C 11/412 365/154 |
| 2014/0119102 A1* | 5/2014 | Shankar | G11C 5/063 365/154 |
| 2015/0043270 A1* | 2/2015 | Singh | G11C 11/416 365/154 |
| 2015/0109852 A1* | 4/2015 | Yang | G11C 8/16 365/154 |
| 2015/0302917 A1* | 10/2015 | Grover | H01L 27/0207 365/51 |
| 2016/0043092 A1* | 2/2016 | Mojumder | H01L 29/1054 257/369 |
| 2017/0365331 A1* | 12/2017 | Chanana | G11C 11/419 |
| 2018/0315472 A1* | 11/2018 | Jung | G11C 7/227 |
| 2018/0315473 A1* | 11/2018 | Yu | G11C 11/54 |
| 2019/0206879 A1* | 7/2019 | Huang | G11C 11/412 |
| 2019/0295633 A1* | 9/2019 | Giterman | G11C 11/4093 |
| 2020/0020386 A1* | 1/2020 | Yu | H01L 27/1116 |

\* cited by examiner

STATIC RANDOM ACCESS MEMORY

CROSS REFERENCE TO RELATED APPLICATION

This application claims priority of China Application No. 201910877534.5 filed on 2019 Sep. 17.

BACKGROUND OF THE INVENTION

1. Field of the Invention

The present invention is related to an SRAM cell, and more particularly, to a 10T-SRAM cell capable of reducing half select disturb and leakage current.

2. Description of the Prior Art

An embedded static random access memory (eSRAM) includes a logic circuit and an SRAM memory coupled to the logic circuit. SRAM is a volatile memory cell built of cross-coupled inverters and capable of retaining data when powered. Unlike DRAM which must be periodically refreshed, SRAM is faster and typically used for cache memory in computer systems.

A prior art six-transistor SRAM (6T-SRAM) memory cell includes two inverters each having a pairs of transistors. The inputs and the outputs of these two inverters are cross-coupled to form a latch circuit which latches data in two storage nodes. Two access transistors are used to control the read/write of the two storage nodes, respectively. In the prior art 6T-SRAM memory cell, a single access transistor is used to control the operation of writing data into or reading data from the same storage node. When the read static noise margin (SNM) and the write margin are reduced in low-voltage operations and with possible process variations, the prior art 6T-SRAM memory cell can face problems such as half-select disturb, read disturb and write failure.

SUMMARY OF THE INVENTION

The present invention provides an SRAM cell which includes a first inverter, a second inverter, a first transistor, a second transistor and a third transistor. The first inverter includes a first end coupled to a first storage node and a second end coupled to a second storage node. The second inverter includes a first end coupled to the second storage node and a second end coupled to the first storage node. The first transistor includes a first end coupled to the first storage node, a second end, and a control end. The second transistor includes a first end coupled to the second end of the first transistor, a second end coupled to a first bit line, and a control end. The third transistor includes a first end coupled between the second end of the first transistor and the first end of the second transistor, a second end, and a control end coupled to the first storage node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
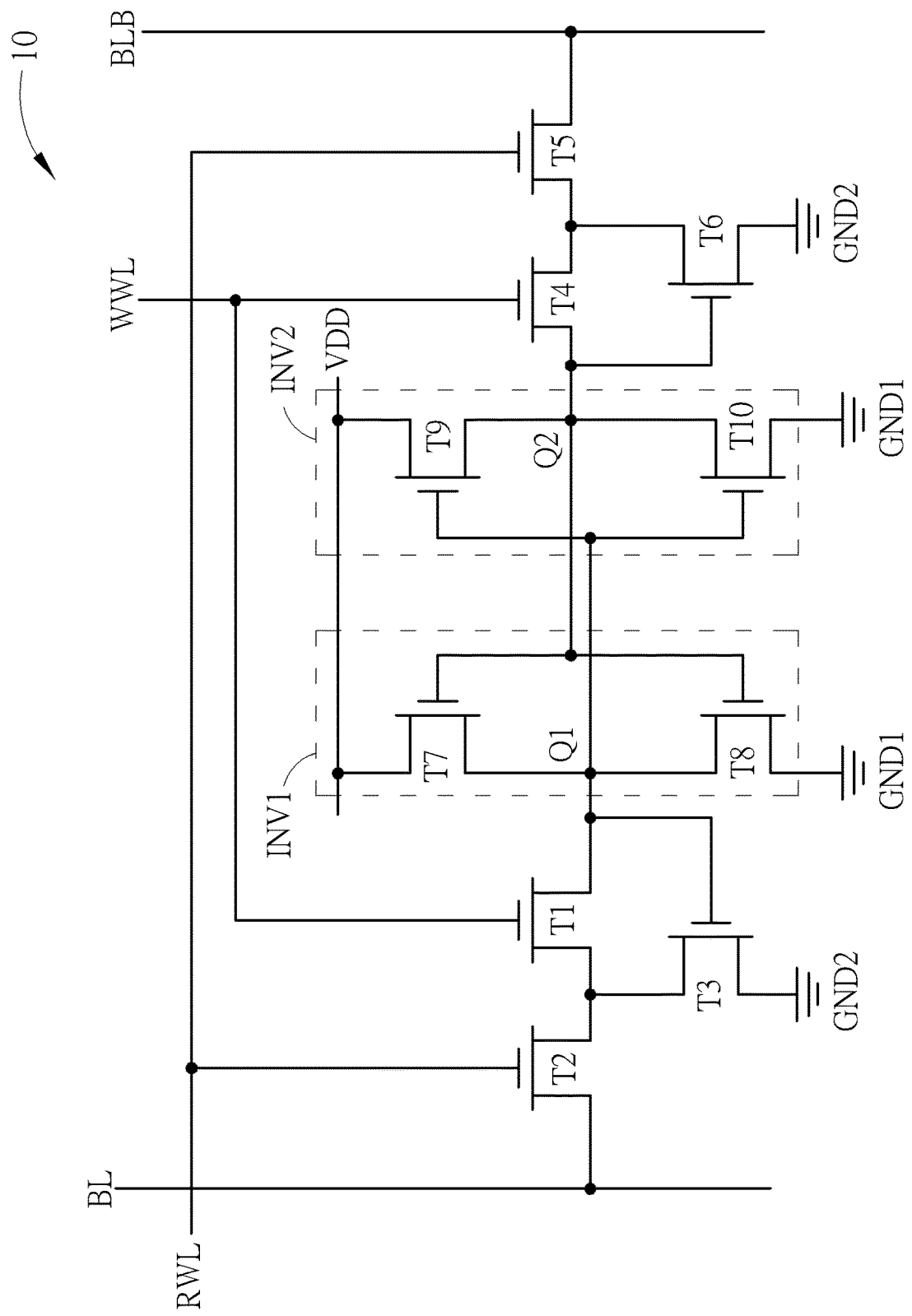
FIG. 1 is a diagram illustrating a 10T-SRAM cell according to an embodiment of the present invention.

FIG. 1 is a diagram illustrating a ten-transistor SRAM (10T-SRAM) cell 10 according to an embodiment of the present invention. The 10T-SRAM cell 10 includes transistors T1~T10 each configured to control the signal path between its first end and its second end according to the voltage level of its control end. In an embodiment of the present invention, each of the transistors T1~T10 may be implemented using a metal-oxide-semiconductor field-effect transistor (MOSFET) or a bipolar junction transistor (BJT). However, the type of the transistors T1~T10 does not limit the scope of the present invention.

The access transistor T1 includes a first end coupled to a storage node Q1, a second end, and a control end coupled to a word line WWL. The access transistor T2 includes a first end coupled to the second end of the access transistor T1, a second end coupled to a bit line BL, and a control end coupled to a word line RWL. The access transistor T3 includes a first end coupled between the second end of the access transistor T1 and the first end of the access transistor T2, a second end coupled to a ground voltage GND2, and a control end coupled to the storage node Q1. The access transistor T4 includes a first end coupled to a storage node Q2, a second end, and a control end coupled to the word line WWL. The access transistor T5 includes a first end coupled to the second end of the access transistor T4, a second end coupled to a bit line BLB, and a control end coupled to the word line RWL. The access transistor T6 includes a first end coupled between the second end of the access transistor T4 and the first end of the access transistor T5, a second end coupled to the ground voltage GND2, and a control end coupled to the storage node Q2.

The pull-up transistor T7 and the pull-down transistor T8 form an inverter INV1 having both ends respectively coupled to a bias voltage VDD and a ground voltage GND1. Similarly, the pull-up transistor T9 and the pull-down transistor T10 form an inverter INV2 having both ends respectively coupled to the bias voltage VDD and the ground voltage GND1. The inverters INV1 and INV2 form a latch circuit which latches data in the storage node Q1 or Q2. More specifically, the storage node Q1 is coupled to the control ends of the pull-up transistor T9 and the pull-down transistor T10, as well as coupled to the first ends of the pull-down transistor T8, the pull-up transistor T7, and the access transistor T1. Similarly, the storage node Q2 is coupled to the control ends of the pull-down transistor T8 and the pull-up transistor T7, as well as coupled to the first ends of the pull-down transistor T10, the pull-up transistor T9, and the access transistor T4.

In the write operation of the 10T-SRAM cell 10, an external bias voltage may be applied via corresponding bit lines BL and BLB in order to change the contents of the storage nodes Q1 and Q2, wherein the access transistors T1 and T2 control the data write-in path between the bit line BL and the storage node Q1, and the access transistors T4 and T5 control the data write-in path between the bit line BLB and the storage node Q2. In the read operation of the 10T-SRAM cell 10, the corresponding bit lines BL and BLB are pre-charged to a specific level before allowing the contents of the storage nodes Q1 and Q2 to influence the levels of the corresponding bit lines BL and BLB. A sense amplifier may be used to enlarge the difference between the voltage difference between the corresponding bit lines BL and BLB for subsequent data readout, wherein the access transistors T2 and T3 control the discharge path from the bit line BL to the ground voltage GND2, and the access transistors T5 and T6 control the discharge path from the bit line BLB to the ground voltage GND2.

During a write operation, the external bias voltage is configured to apply voltages associated with write-in data to the bit lines BL and BLB, and apply turn-on voltages to the word lines RWL and WWL for conducting the access transistors T1, T2, T4 and T5, thereby allowing the voltage levels of the bit lines BL and BLB to change the contents of the storage nodes Q1 and Q2.

During a read operation, the external bias voltage is configured to pre-charge the bit lines BL and BLB to the same level, apply a turn-on voltage to the word line RWL for conducting the access transistors T2 and T5, and apply a turn-off voltage to the word line WWL for cutting off the access transistors T1 and T4. In the above-mentioned latch configuration when the voltage level of the storage node Q1 turns on the access transistor T3 and the voltage level of the storage node Q2 turns off the access transistor T6, the bit line BL may be discharged to the ground voltage GND2 via the conducting access transistors T2 and T3, while the bit line BLB is unaffected by the voltage level of the storage node Q2 due to the cut-off access transistor T6. Similarly, when the voltage level of the storage node Q1 turns off the access transistor T3 and the voltage level of the storage node Q2 turns on the access transistor T6, the bit line BLB may be discharged to the ground voltage GND2 via the conducting access transistors T5 and T6, while the bit line BL is unaffected by the voltage level of the storage node Q1 due to the cut-off access transistor T3.

In the present invention, the data write-in path of the 10T-SRAM cell 10 includes two stacked transistors (T1/T2 or T4/T5). Compared to the single gate dielectric layer in a single transistor, the configuration of two stacked transistors can increase carrier mobility, thereby increasing the driving current and reducing the leakage current. Also, the two stacked transistors in the data write-in path are respectively controlled by the word line RWL and the word line WWL which are disposed to be perpendicular to each other, thereby reducing half select disturb during the write operation of the 10T-SRAM cell 10.

Figure 2:
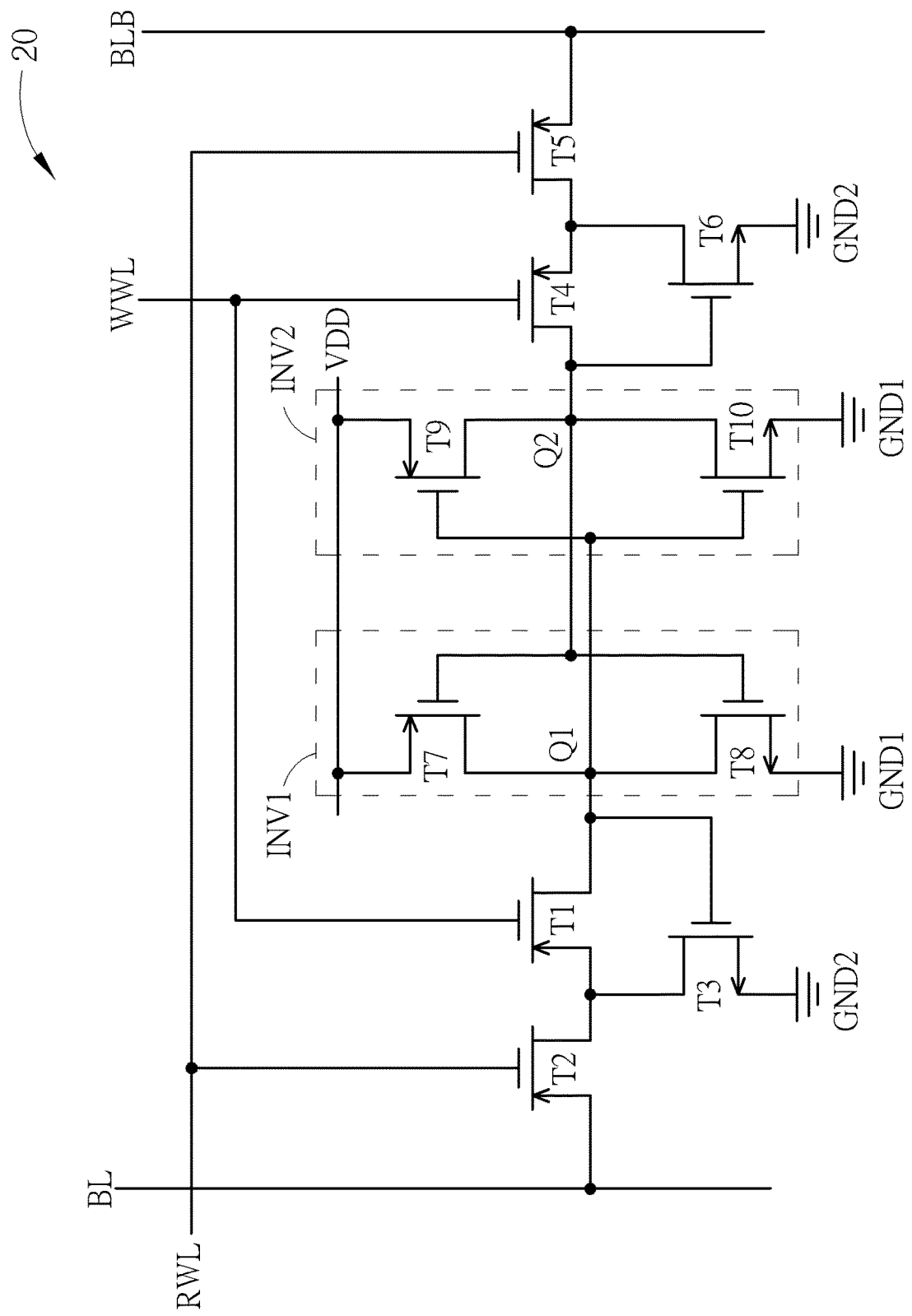
FIG. 2 is a diagram illustrating a 10T-SRAM cell according to another embodiment of the present invention.

FIG. 2 is a diagram illustrating a 10T-SRAM cell 20 according to another embodiment of the present invention. The 10T-SRAM cell 20 includes transistors T1~T10 arranged in the same configuration as those in the 10T-SRAM cell 10. In the embodiment illustrated in FIG. 2, the transistors T1~T2, T4~T5, T7 and T9 are P-type transistors, while the transistors T3, T6, T8 and T10 are N-type transistors. For P-type transistors, the turn-on voltage is logic 0 and the turn-off voltage is logic 1; for N-type transistors, the turn-on voltage is logic 1 and the turn-off voltage is logic 0. Since the transistors T1, T2, T4 and T5 of the same doping type can provide carriers of the same drift velocity, the write margin of the data write-in path may be improved. Also, since the conductivity of the access transistor T2 is determined by the voltage levels of the bit line BL and the word line RWL and the conductivity of the access transistor T5 is directly determined by the voltage levels of the bit line BLB and the word line RWL, the value of the read current will not be limited.

Figure 3:
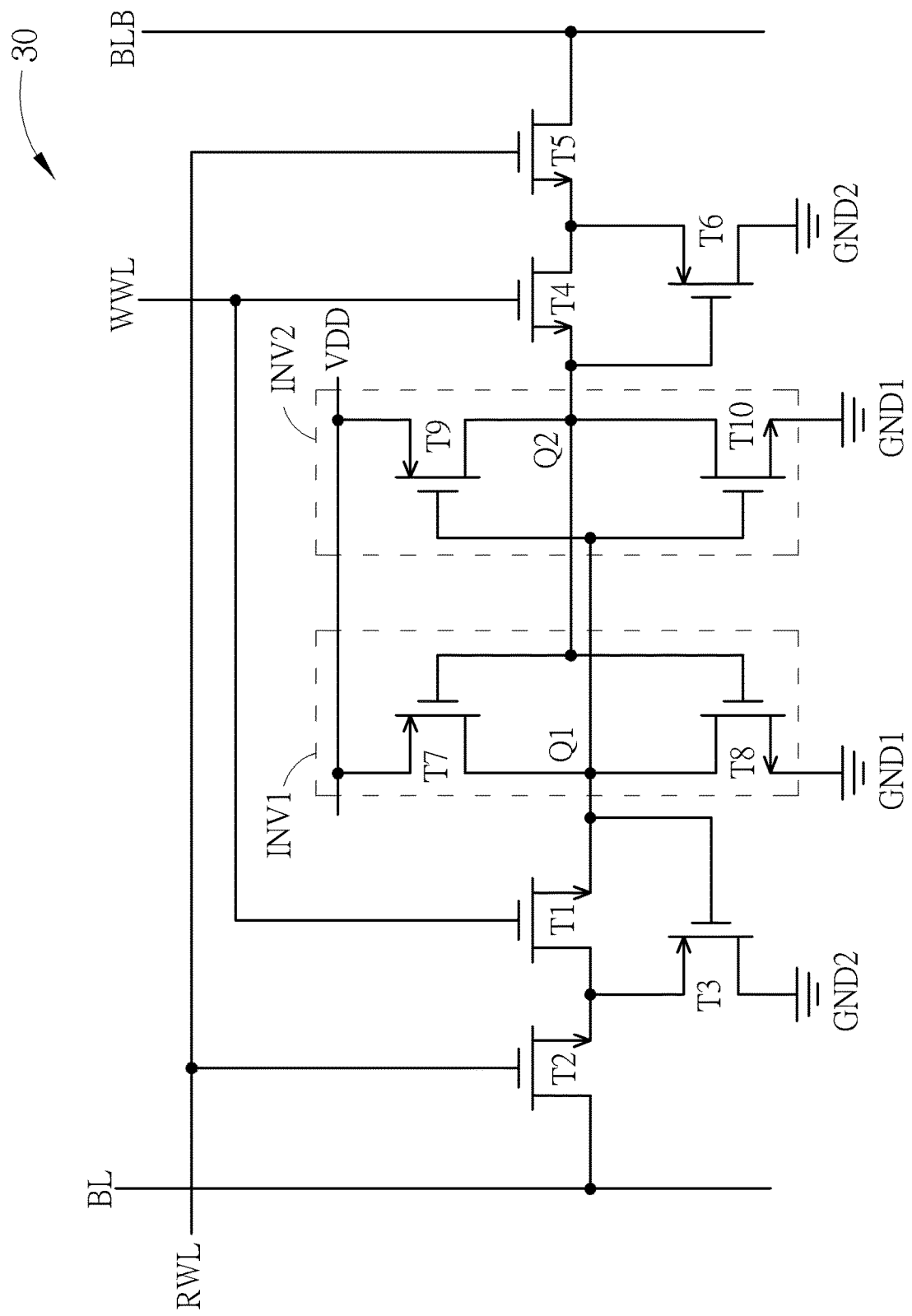
FIG. 3 is a diagram illustrating a 10T-SRAM cell according to another embodiment of the present invention.

FIG. 3 is a diagram illustrating a 10T-SRAM cell 30 according to another embodiment of the present invention. The 10T-SRAM cell 30 includes transistors T1~T10 arranged in the same configuration as those in the 10T-SRAM cell 10. In the embodiment illustrated in FIG. 3, the transistors T1~T2, T4~T5, T8 and T10 are N-type transistors, while the transistors T3, T6, T7 and T9 are P-type transistors. For P-type transistors, the turn-on voltage is logic 0 and the turn-off voltage is logic 1; for N-type transistors, the turn-on voltage is logic 1 and the turn-off voltage is logic 0. Since the transistors T1, T2, T4 and T5 of the same doping type can provide carriers of the same drift velocity, the write margin of the data write-in path may be improved.

In conclusion, the present invention provides a 10T-SRAM cell capable of reducing half select disturb and leakage current, as well we improving the read/write efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random-access memory (SRAM) cell, comprising:
   a first inverter, comprising:
      a first end coupled to a first storage node; and
      a second end coupled to a second storage node;
   a second inverter, comprising:
      a first end coupled to the second storage node; and
      a second end coupled to the first storage node;
   a first transistor, comprising:
      a first end coupled to the first storage node;
      a second end; and
      a control end;
   a second transistor, comprising:
      a first end coupled to the second end of the first transistor;
      a second end coupled to a first bit line; and
      a control end; and
   a third transistor, comprising:
      a first end coupled between the second end of the first transistor and the first end of the second transistor;
      a second end; and
      a control end coupled to the first storage node, wherein a doping type of the second transistor is different from a doping type of the third transistor.

2. The SRAM cell of claim 1, wherein a doping type of the first transistor is the same as a doping type of the second transistor.

3. The SRAM cell of claim 1, wherein:
   the first transistor and the second transistor have a first doping type;
   the third transistor has a second doping type; and
   the first doping type is different from the second doping type.

4. The SRAM cell of claim 1, wherein:
   the control end of the second transistor is coupled to a first word line;
   the control end of the first transistor is coupled to a second word line; and
   the first word line is disposed to be perpendicular to the second word line.

5. The SRAM cell of claim 1, further comprising:
   a fourth transistor, comprising:
      a first end coupled to the second storage node;
      a second end; and a control end coupled to the control end of the first transistor;
a fifth transistor, comprising:
   a first end coupled to the second end of the fourth transistor;
   a second end coupled to a second bit line; and
   a control end coupled to the control end of the second transistor; and
a sixth transistor, comprising:
   a first end coupled between the second end of the fourth transistor and the first end of the fifth transistor;
   a second end coupled to the second end of the third transistor; and
   a control end coupled to the second storage node.

6. The SRAM cell of claim 5, wherein:
a doping type of the fifth transistor is different from a doping type of the sixth transistor.

7. The SRAM cell of claim 5, wherein:
a doping type of the first transistor is the same as a doping type of the second transistor; and
a doping type of the fourth transistor is the same as a doping type of the fifth transistor.

8. The SRAM cell of claim 5, wherein:
the first transistor, the second transistor, the fourth transistor and the fifth transistor have a first doping type;
the third transistor and the sixth transistor have a second doping type; and
the first doping type is different from the second doping type.

9. The SRAM cell of claim 5, wherein:
the control end of the second transistor and the control end of the fifth transistor are coupled to a first word line;
the control end of the first transistor and the control end of the fourth transistor are coupled to a second word line; and
the first word line is disposed to be perpendicular to the second word line.

* * * * *